US011201062B2

(12) United States Patent
Iijima et al.

(10) Patent No.: US 11,201,062 B2
(45) Date of Patent: Dec. 14, 2021

(54) METHOD AND APPARATUS FOR PROCESSING A SUBSTRATE

(71) Applicant: Tokyo Electron Limited, Tokyo (JP)

(72) Inventors: Yuki Iijima, Miyagi (JP); Toru Hisamatsu, Hillsboro, OR (US); Kae Kumagai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/910,093

(22) Filed: Jun. 24, 2020

(65) Prior Publication Data
US 2020/0411325 A1 Dec. 31, 2020

(30) Foreign Application Priority Data
Jun. 28, 2019 (JP) .............................. JP2019-122068

(51) Int. Cl.
H01L 21/3065 (2006.01)
H01L 21/311 (2006.01)
G03F 7/20 (2006.01)
H01L 21/768 (2006.01)
H01L 21/67 (2006.01)
H01L 21/3213 (2006.01)

(52) U.S. Cl.
CPC ...... H01L 21/3065 (2013.01); G03F 7/70033 (2013.01); G03F 7/70616 (2013.01); H01L 21/31116 (2013.01); H01L 21/31122 (2013.01); H01L 21/31138 (2013.01); H01L 21/32136 (2013.01); H01L 21/67069 (2013.01); H01L 21/76897 (2013.01)

(58) Field of Classification Search
None
See application file for complete search history.

(56) References Cited

U.S. PATENT DOCUMENTS

2009/0045165 A1* 2/2009 Narishige ......... H01L 21/31122
216/41

FOREIGN PATENT DOCUMENTS

JP 2009-049141 A 3/2009

OTHER PUBLICATIONS

H. Xiao, Introduction to Semiconductor Manufacturing Technology, published by Prentice Hall, ISBN 0-13-022404-9, p. 334. (Year: 2001).*

* cited by examiner

Primary Examiner — Jiong-Ping Lu
(74) Attorney, Agent, or Firm — Xsensus LLP

(57) ABSTRACT

A method for processing a substrate includes a step of providing a substrate and a first step. In the step of providing a substrate, a substrate having a first film and a second film formed on the first film and having a pattern formed thereon is provided. In the first step, a protective film is formed on a side wall of the first film by a product generated by sputtering of the second film while a first processing gas is turned into plasma and the first film is etched simultaneously with the sputtering of the second film.

9 Claims, 16 Drawing Sheets

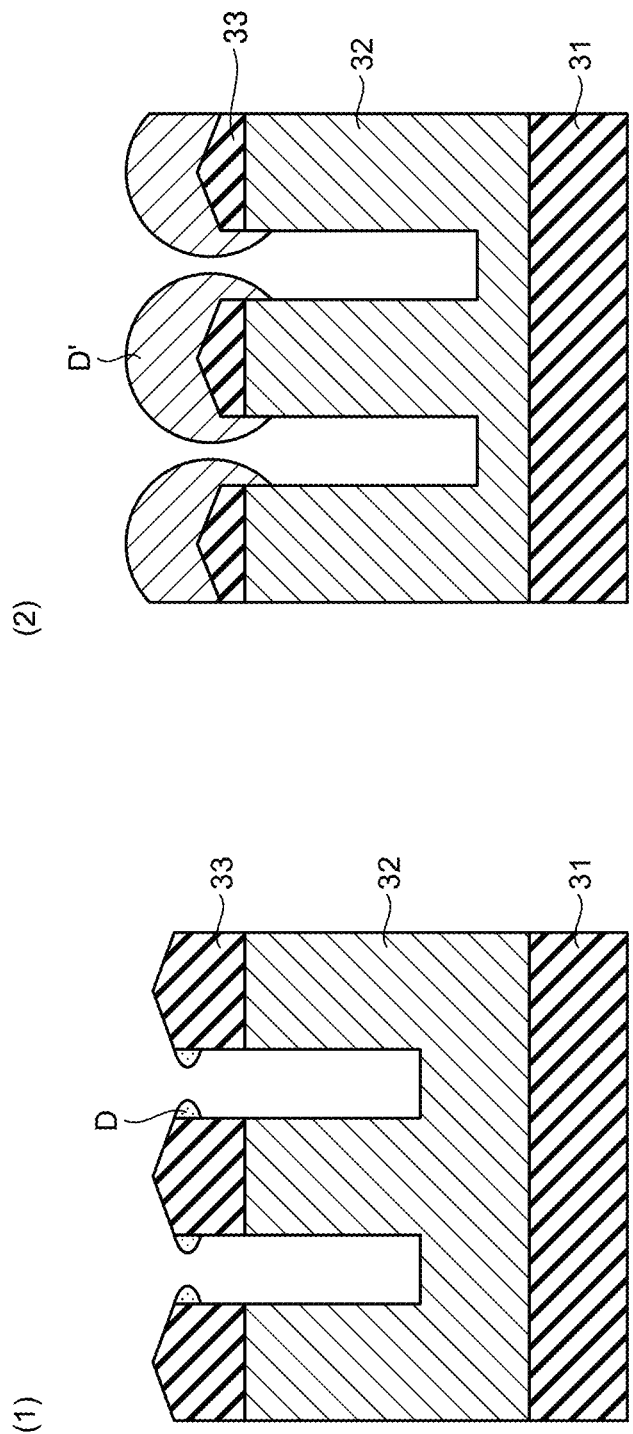

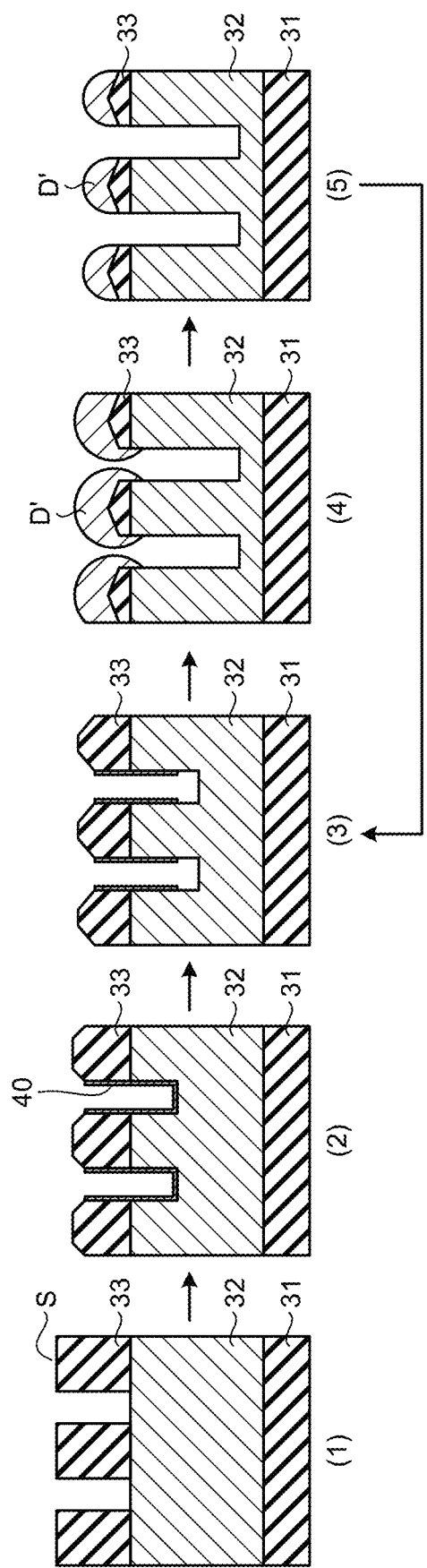

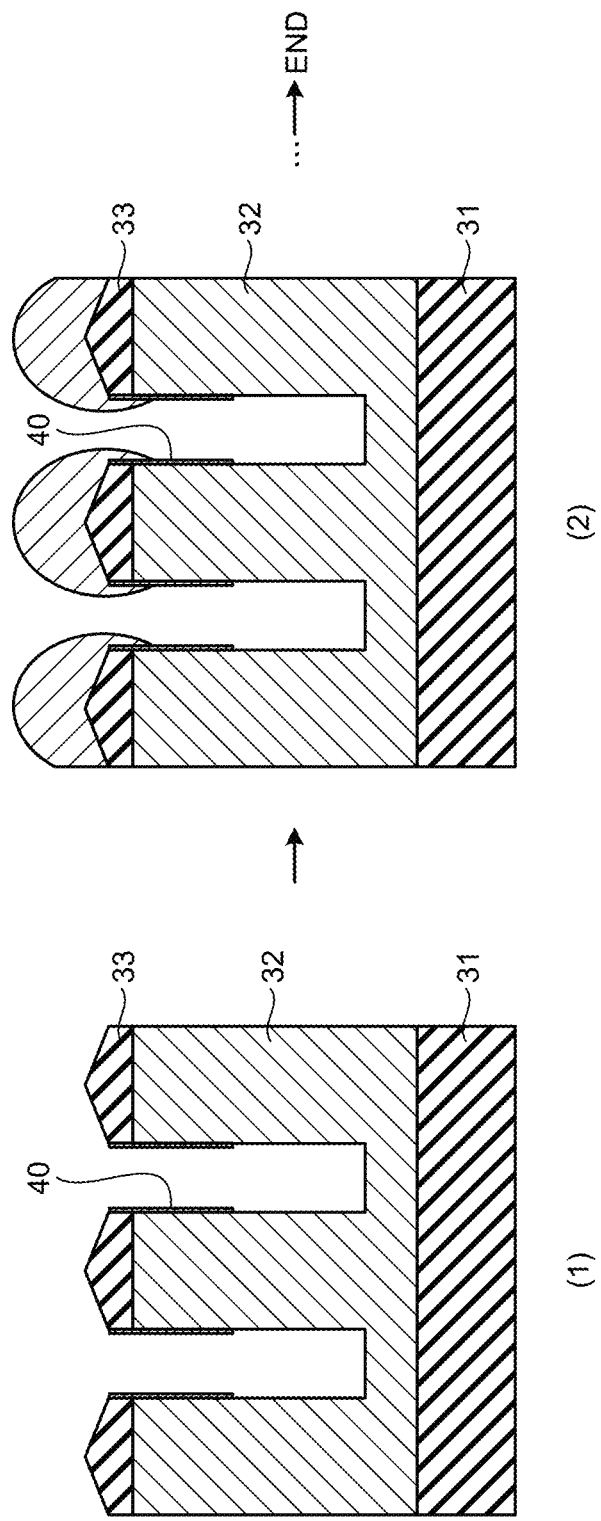

METHOD AND APPARATUS FOR PROCESSING A SUBSTRATE

CROSS-REFERENCE TO RELATED APPLICATION(S)

This application is based on and claims priority from Japanese Patent Application No. 2019-122068 filed on Jun. 28, 2019 with the Japan Patent Office, the disclosure of which is incorporated herein in its entirety by reference.

FIELD

The present disclosure relates to a method and an apparatus for processing a substrate.

BACKGROUND

Conventionally, plasma etching is used in forming a cylinder hole, a contact hole, or other structure in manufacturing a semiconductor device. In recent years, a shape abnormality such as bowing in a high aspect ratio contact (HARC) hole has been an issue.

According to one technique, for example, on a substrate, an organic film, a silicon-containing film, and a patterned mask may be formed in this order from below. Then, a recess may be formed in the organic film. Then, a protective film may be formed on an inner wall surface of the recess by sputtering the silicon-containing film (see, for example, JP-A-2009-49141).

SUMMARY

The disclosure is directed towards a technique for controlling a shape of a pattern formed by etching on a substrate.

According to an aspect of the embodiment, a method for processing a substrate is provided, including providing a substrate including a first film and a second film formed on the first film and having an opening formed in the second film, and turning a first processing gas into plasma to etch the first film and to form a protective film on a sidewall of the first film by sputtering of the second film.

According to the embodiment, it is possible to control the shape of a pattern formed on the substrate by etching.

BRIEF DESCRIPTION OF DRAWINGS

FIG. 6A describes a step for preventing clogging in accordance with a method for processing a substrate of one embodiment;

FIG. 7A shows exemplary structures for explaining the flow of FIG. 1;

FIG. 7B shows another exemplary structure for explaining the flow of FIG. 1;

DESCRIPTION OF EMBODIMENTS

Hereinafter, various embodiments will be described in detail with reference to the drawings. The present embodiments are not intended to be limiting. Further, respective embodiments can be appropriately combined as far as the combination is consistent with the disclosure.

Figure 15A:
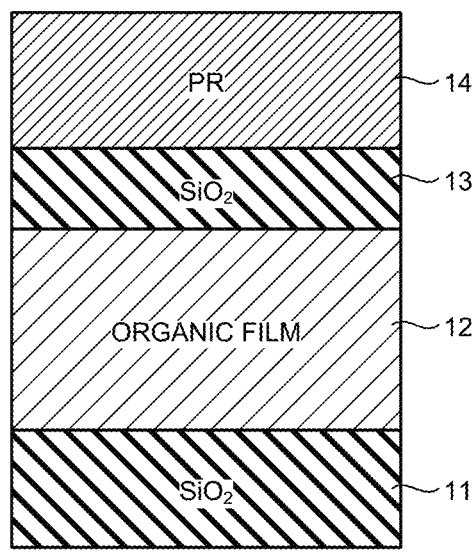
FIG. 15A describes a structure formed in a process of manufacturing a semiconductor device.
Figure 15B:
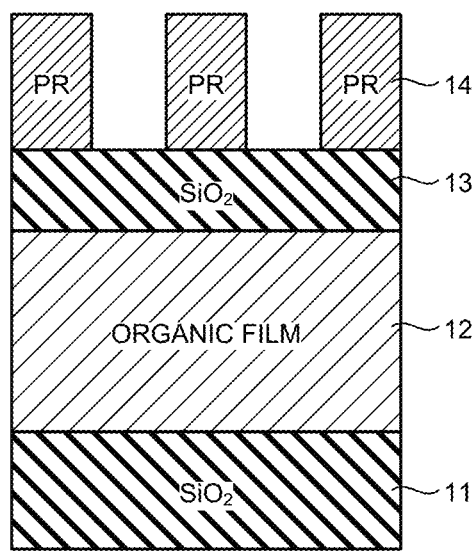
FIG. 15B describes a pattern formed in a photoresist in a process of manufacturing a semiconductor device.
Figure 15C:
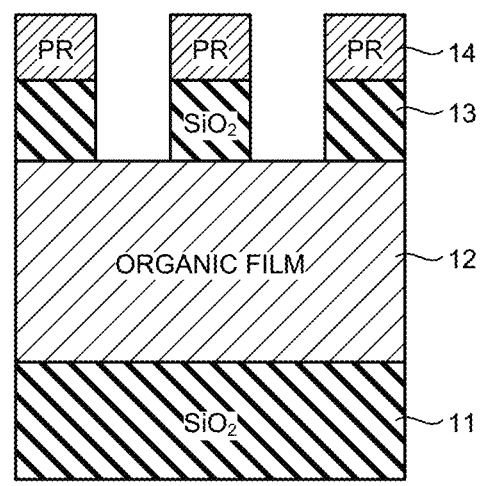
FIG. 15C describes a pattern formed in a silicon-containing film in a process of manufacturing a semiconductor device.
Figure 15D:
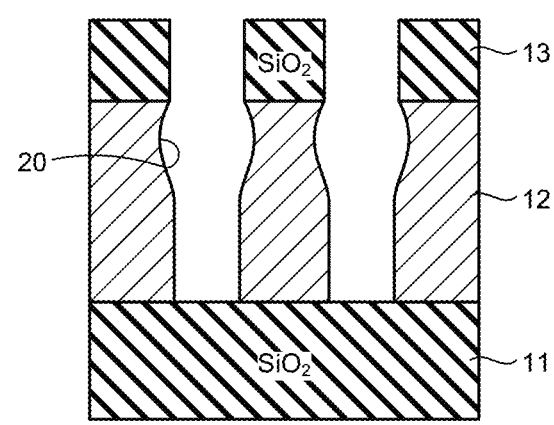
FIG. 15D describes a pattern formed in a mask in a process of manufacturing a semiconductor device.

Example of a Shape Abnormality Occurring in a Process of Manufacturing a Semiconductor Device Prior to describing the embodiment, a shape abnormality occurring in a process of manufacturing a semiconductor device will be described. FIG. 15A shows a structure formed in manufacturing a semiconductor device. FIGS. 15B, 15C, and 15D respectively show a pattern formed in a photoresist, a pattern formed in a silicon-containing film, and a pattern formed in a mask.

FIG. 15A shows a structure including an insulating film 11, an organic film 12 that is to be etched, a silicon-containing film 13, and a photoresist (PR) 14 in this order from below. In the example shown in FIG. 15A, the insulating film 11 is, for example, a silicon oxide ($SiO_2$) film, a silicon nitride (SiN) film, a silicon oxynitride (SiON) film or a silicon carbon-nitride (SiCN). The insulating film 11 may include a stack of $SiO_2$ and SiN, a stack of $SiO_2$ and polycrystalline silicon (Poly-Si), or a stack of $SiO_2$ and SiON. The organic film 12 is, for example, a film containing carbon as a main component. The organic film 12 is, for example, an amorphous carbon film (ACL: Amorphous Carbon Layer). The silicon-containing film 13 is an inorganic film containing silicon as a main component. The silicon-containing film 13 is, for example, a $SiO_2$ film, a SiN film, a SiON film, a Poly-Si film, or SiCN film. The silicon-containing film 13 may be formed of such a material that it functions as an anti-reflection film (Arc: Anti-Reflection Coating) in a lithography process.

After the structure shown in FIG. 15A is provided, the photoresist 14 is patterned by photolithography as shown in FIG. 15B. The photoresist 14 may be subject to EUVL (Extreme Ultraviolet Lithography). Subsequently, an etching gas such as CF4 is turned into plasma to etch the silicon-containing film 13. The silicon-containing film 13 is removed (etched) along the photoresist pattern 14, so that the silicon-containing film 13 is patterned as shown in FIG. 15C. Furthermore, O2 gas, H2 gas, N2 gas, or a mixed gas containing H2 gas and N2 gas, or the like is turned into plasma and the organic film 12 is etched through the patterned silicon-containing film 13. The organic film 12 is patterned to form a mask shown in FIG. 15D. The patterned organic film 12 functions as a mask when the insulating film 11 below the organic film 12 is etched.

The organic film 12 is isotropically etched by oxygen radicals, and a bowing 20, i.e., a side-etched portion in a vertical section of the mask pattern, is formed as shown in FIG. 15D. When the insulating film 11 is etched through the mask pattern with the bowing 20, the shape of the organic film 12 is transferred to the insulating film 11, and the shape of a hole formed in the insulating film 11 is deformed.

EMBODIMENT

In the embodiment described below, when the organic film is etched using the silicon-containing film as a hard mask, a product (deposit) generated by sputtering the silicon-containing film forms a protective film for reducing side etch of the organic film. In a method for processing a substrate according to a first embodiment, the area where the protective film is formed is, for example, an area of an aspect ratio of at least 5 within a pattern (recess) in the organic film on the substrate; more specifically the protective film is formed in an area of an aspect ratio of 5 to 7 within the pattern (recess) in the organic film. Further, in the method for processing a substrate according to the first embodiment, the shape of the pattern formed on a substrate by etching is controlled by combining a plurality of process steps. In one of the steps, product formed through sputtering realizes the protection of side walls of the pattern.

Figure 2:
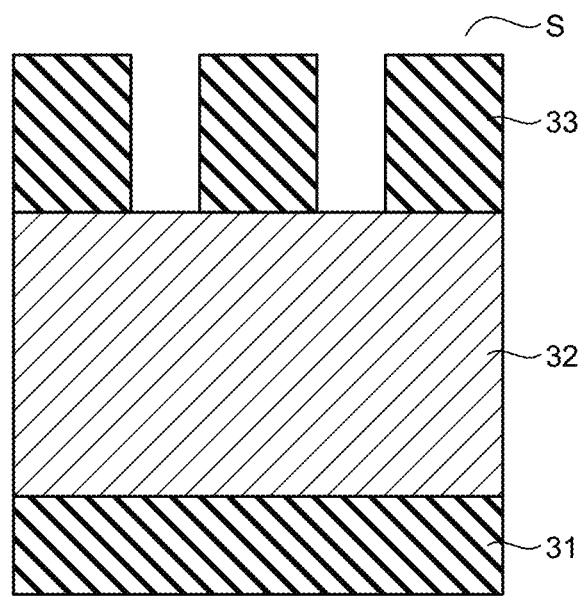
FIG. 2 describes an exemplary structure processed by a method for processing a substrate according to one embodiment.

In the method for processing a substrate according to one embodiment, a structure S (see FIG. 2) having an insulating film 31, an organic film 32, and a silicon-containing film 33 stacked in this order on a substrate is processed. In the process, the organic film 32 is patterned to form a mask for etching the insulating film 31. FIG. 2 describes an exemplary structure processed by the method for processing a substrate according to one embodiment.

The insulating film 31 is, for example, a SiO2 film. The insulating film 31 is etched through the patterned organic film 32 to form a predetermined pattern. The pattern formed in the insulating film 31 may be a cylinder hole, a contact hole, and the like of a semiconductor device.

The organic film 32 is, for example, a film primarily containing carbon. The organic film 32 is, for example, an amorphous carbon film. The method for processing a substrate according to the present embodiment controls mainly the shape formed through the etching in the organic film 32.

The silicon-containing film 33 is, for example, a SiO2 film, a SiN film, a SiON film, a Poly-Si film, or a SiCN film. The silicon-containing film 33 may be formed of such a material that it functions as an anti-reflection film in a lithography process. When etching the organic film 32, the silicon-containing film 33 functions as a hard mask. A predetermined pattern, which may be referred to as "opening" hereinafter, is formed in the silicon-containing film 33.

The method for processing a substrate according to one embodiment controls the shape of a pattern formed in the organic film 32 by combining the following steps (1) to (4).
(1) Step for forming a protective film
(2) Step of etching
(3) Step for building up a mask
(4) Step for preventing clogging Step for Forming a Protective Film In the step for forming a protective film, a processing gas is turned into plasma, and the organic film 32 is etched while the silicon-containing film 33 is sputtered. The products generated from the sputtering of the silicon-containing film 33 are deposited on a side wall of a recess in the organic film 32 and form a protective film 40. The processing gas used in this step is one example of a first processing gas, and the step for forming a protective film is one example of a first step.

Figure 3:
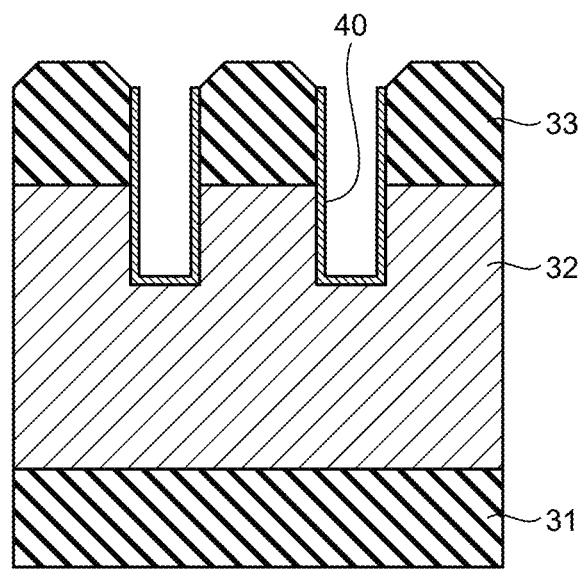
FIG. 3 describes a step of forming a protective film in accordance with a method for processing a substrate according to one embodiment.

FIG. 3 is a diagram for explaining the step for forming a protective film according to one embodiment. The structure S shown in FIG. 2 has been subjected to the step for forming a protective film. The processing gas used in this step contains, for example, hydrogen (H2). The processing gas is turned into plasma, and the structure S is exposed to the plasma. The silicon-containing film 33 is sputtered by being exposed to the plasma generated from H2, and sputtered products scatter and are deposited on the side wall of the recess of the organic film 32. The structure S shown in FIG. 3 includes the protective film 40 deposited on the side wall of the recess of the organic film 32 and the silicon-containing film 33. In the step for forming a protective film, the formation of the protective film 40 by sputtering the silicon-containing film 33 and the etching of the recess of the organic film 32 proceed simultaneously as the plasma is generated from the processing gas. The processing gas may contain H2 alone or may be a mixed gas containing N2 (nitrogen) gas and H2 gas.

Step of Etching

Figure 4:
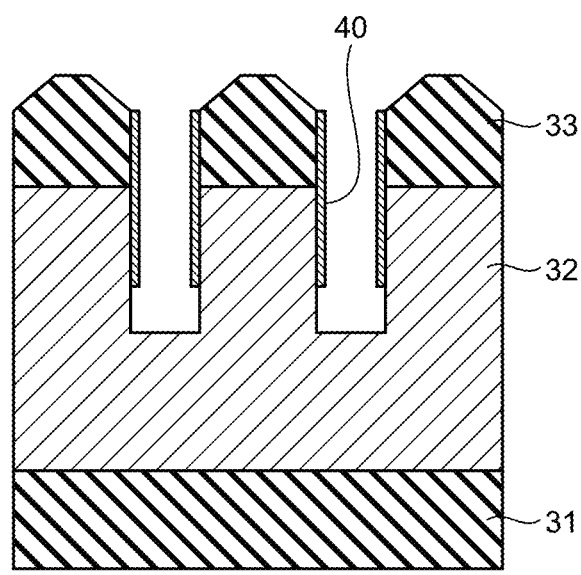
FIG. 4 describes a step of etching in accordance with a method for processing a substrate of one embodiment.

FIG. 4 is a diagram for explaining the step of etching of the method for processing a substrate according to one embodiment. In the step of etching, the processing gas is turned into plasma, and the organic film 32 is etched in a depth direction using the silicon-containing film 33 as a mask. The processing gas used in this step is one example of a second processing gas. The step of etching is one example of a second step. The organic film 32 is etched using a mixed gas containing O2 (oxygen) gas and carbonyl sulfide (COS) gas, for example. The processing gas may include Cl2 (chlorine), HBr (hydrogen bromide), or the like. The processing gas is prepared so as to etch mainly the organic film 32. When the step of etching is performed on the organic film 32, the silicon-containing film 33 serving as a hard mask is gradually removed, and a recess with a shape corresponding to the shape of the opening in the silicon-containing film 33 is formed in the organic film 32, and the recess gradually becomes deeper.

Step for Building Up a Mask

Figure 5A:
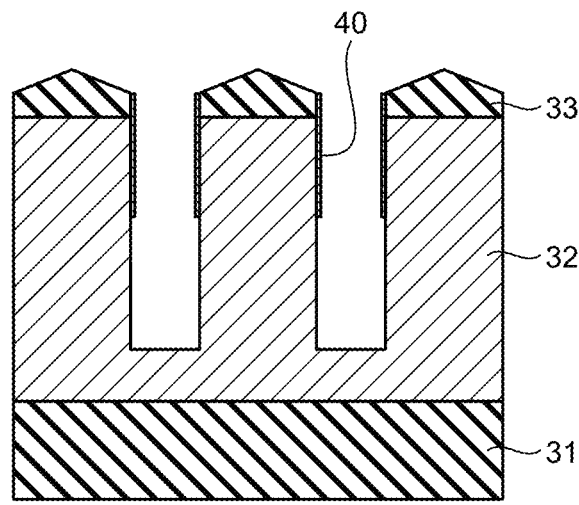
FIG. 5A describes a step for building up a mask in accordance with a method for processing a substrate of one embodiment.
Figure 5B:
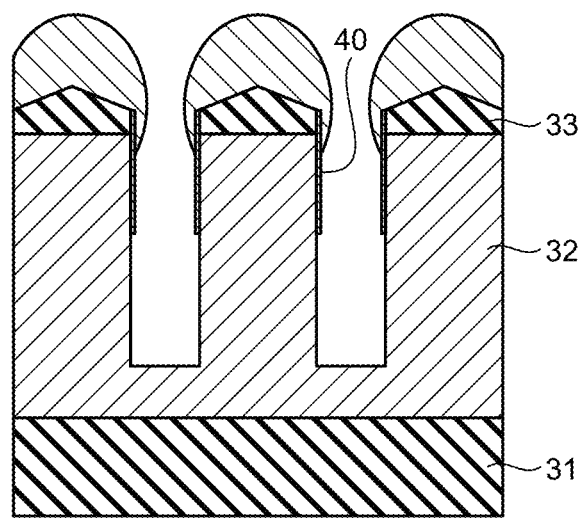
FIG. 5B further describes a step for building up a mask in accordance with a method for processing a substrate of one embodiment.

In the step for building up a mask, the thickness of the silicon-containing film 33 on the mask is increased by, for example, anisotropic formation of a film. The step for building up a mask is one example of a third step. FIGS. 5A and 5B are diagrams for explaining the step for building up the mask according to one embodiment. As shown in FIG. 5A, the thickness of the silicon-containing film 33 has been gradually reduced in the step for forming a protective film and the step of etching. When the pattern to be formed in the organic film 32 has a high aspect ratio, the silicon-containing film 33, i.e., a hard mask, may disappear before the bottom of the pattern reaches the insulating film 31. To avoid this, a film is formed on the silicon-containing film 33 using plasma of a third processing gas in the step for building up a mask. The conditions for forming the film are set to be anisotropic. That is, the conditions are set such that a film is mainly formed on the top of the silicon-containing film 33 while the opening is not clogged (see FIG. 5B).

The third processing gas used in the step for building up a mask may be a mixed gas containing a silicon halide gas such as SiCl4 or SiF4, a rare gas such as argon (Ar), and O2. The third processing gas is turned into plasma, and the structure S is exposed to the plasma. Particular techniques employed for forming a film in the step for building up a mask is not limited. Such technique may include a chemical vapor deposition (CVD), a physical vapor deposition (PVD), an atomic layer deposition (ALD), a direct current superposition (DCS) and others. The composition of the film formed in the step for building up a mask does not need to be the same as that of the silicon-containing film 33. The film formed in the step for building up a mask may be a silicon-containing film having a composition different from that of the silicon-containing film 33. Further, the film formed in the step for building up a mask may be of a material having a high selectivity with respect to the organic film 32, and may not be a silicon-containing film.

Step for Preventing Clogging

Figure 6B:
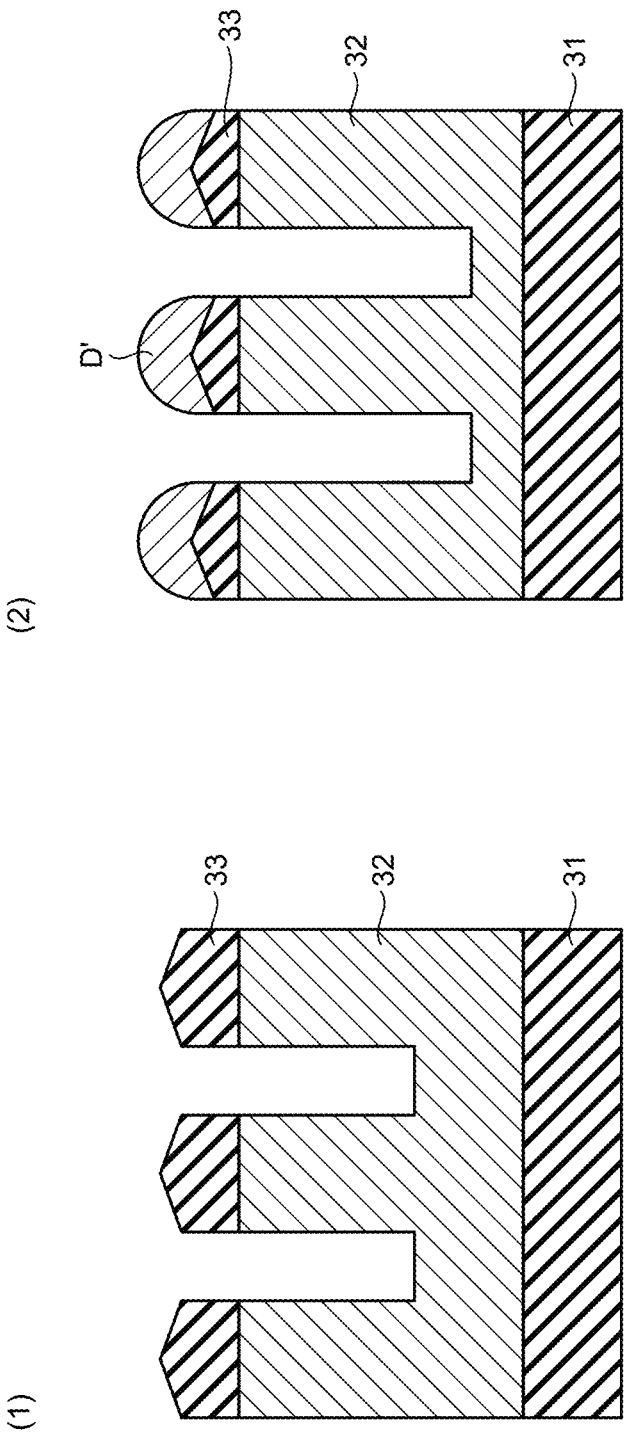
FIG. 6B further describes a step for preventing clogging in accordance with a method for processing a substrate of one embodiment.

FIGS. 6A and 6B are diagrams for explaining the step for preventing clogging according to one embodiment. The step for preventing clogging removes by a processing gas containing fluorine (F) deposits that may clog the upper portion of the pattern and/or the opening. Such deposits may be generated in any of the steps including the step for forming a protective film, the step of etching, and the step for building up a mask. The processing gas used in the step for preventing clogging is one example of a fourth processing gas. The step for preventing clogging is one example of a fourth step. As shown in FIG. 6A, while a pattern is formed in the structure S, products (D in (1) of FIG. 6A) may be generated by etching and adhere to the side wall of the opening. Then, the opening may be gradually clogged. In addition, while the mask is being build up, products (D' in (2) of FIG. 6A) may grow in a horizontal direction, and gradually clog the upper portion of the pattern or the opening. In the step for preventing clogging, an excessive deposits (product) that may clog the opening or the pattern are removed by plasma generated from a fluorine-containing gas. When the products D or the products D' are partially removed, the dimension of the opening of the silicon-containing film 33 is recovered ((1) and (2) in FIG. 6B), and the processing gas can be evenly delivered to the bottom of the pattern in a subsequent step (e.g., step of etching). The processing gas used in the step for preventing clogging may be, for example, a mixed gas of a fluorine-containing gas such as CHF3 and CF4, and a rare gas such as N2 gas or argon (Ar) gas.

Figure 1:
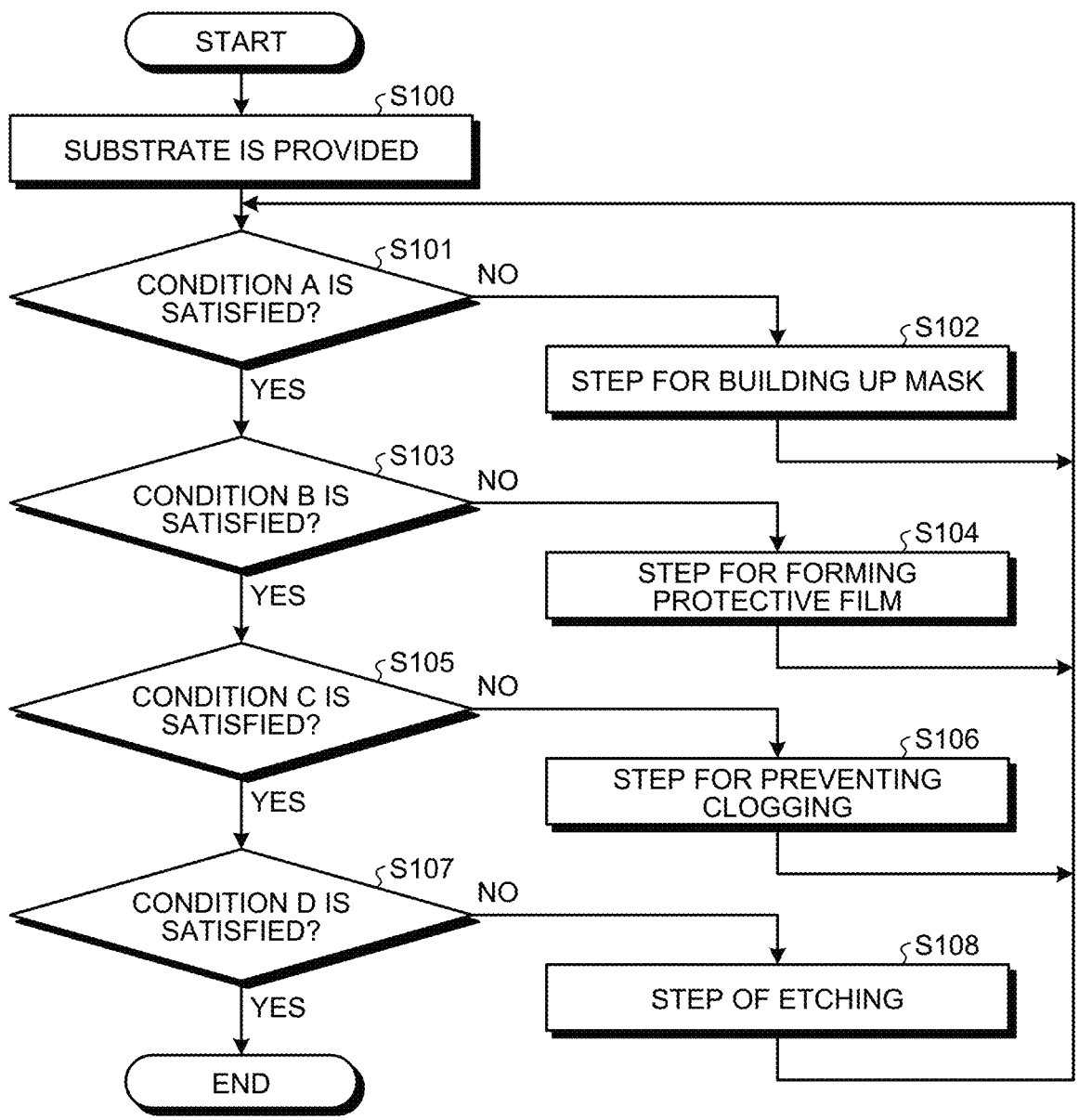
FIG. 1 is a flowchart of an exemplary method for processing a substrate according to one embodiment.

Next, the method for processing a substrate according to one embodiment will be described with reference to FIGS. 1 and 7A. FIG. 1 is a flowchart showing an exemplary flow of the method for processing a substrate according to one embodiment. FIG. 7A is a diagram for explaining an exemplary flow of FIG. 1.

First, the structure S is prepared (Step S100, (1) of FIG. 7A). Subsequently, it is determined whether or not the structure S satisfies a condition A (Step S101). The condition A is, for example, that the thickness of the silicon-containing film 33 on the organic film 32 is equal to or greater than a predetermined value. In this embodiment, the structure S generally satisfies the condition A (Step S101, Yes) when the step S101 is first performed, i.e., in a first cycle. Then, the process proceeds to Step S103 without performing the step for building up a mask. In the second and subsequent cycles, it may be determined that the structure S does not satisfy the condition A (Step S101, No). Then, the step for building up a mask is performed (Step S102).

In Step S103, it is determined whether or not the structure S satisfies a condition B. The condition B is, for example, that the aspect ratio of the pattern formed on the organic film 32 reaches a predetermined value α. For example, the predetermined value α is 5. Further, for example, the condition B is that the protective film 40 (see FIG. 3) is formed on the patterned organic film 32.

When it is determined that the structure S does not satisfy the condition B (Step S103, No), the step for forming a protective film is performed (Step S104, (2) of FIG. 7A). For example, when no pattern is formed in the organic film 32, it is determined that the structure S does not satisfy the condition B. Then, the step for forming a protective film is performed. During this step, the organic film 32 is etched. Simultaneously, the silicon-containing film 33 is sputtered, and products generated by the sputtering are deposited on the side wall of the pattern (recess) formed in the organic film 32 and form the protective film 40. When Step S104 finishes, the process returns to Step S101. At Step S101, when it is determined that the thickness of the silicon-containing film 33 is reduced in the step for forming a protective film and the structure S does not satisfy the condition A (Step S101, No), the step for building up a mask is performed (Step S102).

When it is determined that the structure S satisfies the condition B (Step S103, Yes), the process proceeds to Step S105. It is determined that the structure S satisfies the condition B, for example, when the aspect ratio of the pattern formed in the organic film 32 is 6. Further, it is determined that the structure S satisfies the condition B, for example, when the aspect ratio of the pattern in the organic film 32 reaches 5 as a result of performing the step for forming a protective film several times. When it is determined that the structure S satisfies the condition B, the process proceeds to Step S105.

In one embodiment, once the structure S satisfies the condition B, the protective film need not be formed in the subsequent steps. In this case, the determination in Step S103 is set such that once the process proceeds to Step S105, the determination in Step S103 may be always YES. However, when the protective film 40 is removed by repeatedly performing Step S106 and the structure S does not satisfy the condition B (Step S103, No), the step for forming a protective film may be performed (Step S104).

In Step S105, it is determined whether or not the structure S satisfies a condition C. The condition C is, for example, that the dimension of the opening of the silicon-containing film 33 is equal to or greater than a predetermined dimension. When it is determined that the structure S does not satisfy the condition C (Step S105, No), the step for preventing clogging is performed (Step S106). When Step S106 finishes, the process returns to Step S101. On the other hand, when it is determined that the structure S satisfies the condition C (Step S105, Yes), the process proceeds to Step S107.

In Step S107, it is determined whether or not the structure S satisfies a condition D. The condition D is, for example, that the aspect ratio of the pattern formed in the organic film 32 is equal to or greater than a predetermined value β, different from the predetermined value α. For example, the predetermined value β, indicating an aspect ratio is 20 to 30. When it is determined that the structure S does not satisfy the condition D (Step S107, No), the step of etching is performed (Step S108, (3) of FIG. 7A). When Step S108 finishes, the process returns to Step S101. At this time, the thickness of the silicon-containing film 33 may have been reduced due to Step S104 and Step S108, and thus it may be determined that the structure S does not satisfy the condition A (Step S101, No). Then, the step for building up a mask is performed (Step S102, (4) of FIG. 7A). Further, the size of the opening of the silicon-containing film 33 may have been reduced due to Step S102 and Step S108, and then it may be determined that the structure S does not satisfy the condition C (Step S106, No). In this case, the step for preventing clogging is performed (Step S106, (5) of FIG. 7A).

When it is finally determined in Step S107 that the structure S satisfies the condition D (Step S107, Yes) by repeatedly performing the above process, the process ends.

FIG. 7B is a diagram for explaining another exemplary flow of FIG. 1. In (1) of FIG. 7B, it is assumed that a large amount of the silicon-containing film 33 of the structure S has been removed, but the film thickness is not less than a predetermined value of the condition A (Step S101, Yes). Further, it is assumed that the aspect ratio of the pattern of the mask is less than the predetermined value β (Step S107, No). Then, the step of etching is performed to etch the pattern of the mask (Step S108). As a result of the etching, it is assumed that the silicon-containing film 33 has been reduced and the film thickness is less than a predetermined value (Step S101, No). Then, the step for building up a mask is performed to increase the height of the mask ((2) of FIG. 7B). When the structure S satisfies the conditions A to D, the process ends.

In this way, according to the method for processing a substrate shown in FIG. 1, the step to be performed is selected according to the state of the processed structure S. The step for forming a protective film, the step of etching, the step for building up a mask, and the step for preventing clogging are selectively performed by appropriately setting the conditions A to D for determining whether or not to perform each process step. Hence, the process suitable for the state of the structure S can be performed. The determination as to whether or not the structure S satisfies the conditions A to D may be made by setting in advance the number of times each step is to be performed until the conditions A to D are satisfied. In addition, the processing condition of each step may be set in advance. For example, whether or not the conditions A to D are satisfied may be determined based on the number of times each step has been performed.

In the example shown in FIG. 1, each step is performed after the corresponding determination is made based on the conditions A to D as to whether or not to perform the step for forming a protective film, the step of etching, the step for building up a mask, and the step for preventing clogging. However, the flow of the method for processing a substrate according to the present embodiment is not limited to the flow shown in FIG. 1. A combination of steps may be selected in advance from the step for forming a protective film, the step of etching, the step for building up a mask, and the step for preventing clogging. Then, the order and the number of times the selected steps are to be performed may be set in advance. For example, a cycle including any of the step for forming a protective film, the step of etching, the step for building up a mask, and the step for preventing clogging may be determined in advance, and each cycle may be performed a predetermined number of times.

Figure 8:
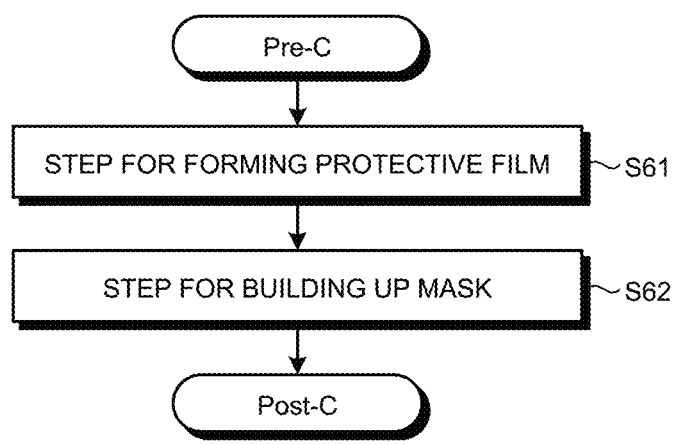
FIG. 8 is a flowchart of exemplary cycle 1 of a method for processing a substrate according to one embodiment.
Figure 9:
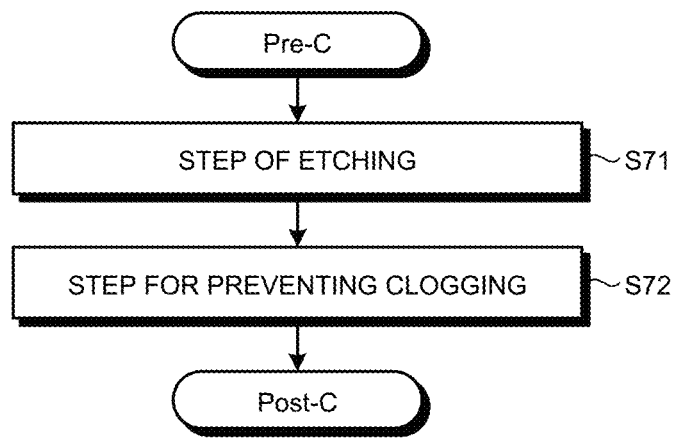
FIG. 9 is a flowchart of exemplary cycle 2 of a method for processing a substrate according to one embodiment.
Figure 10:
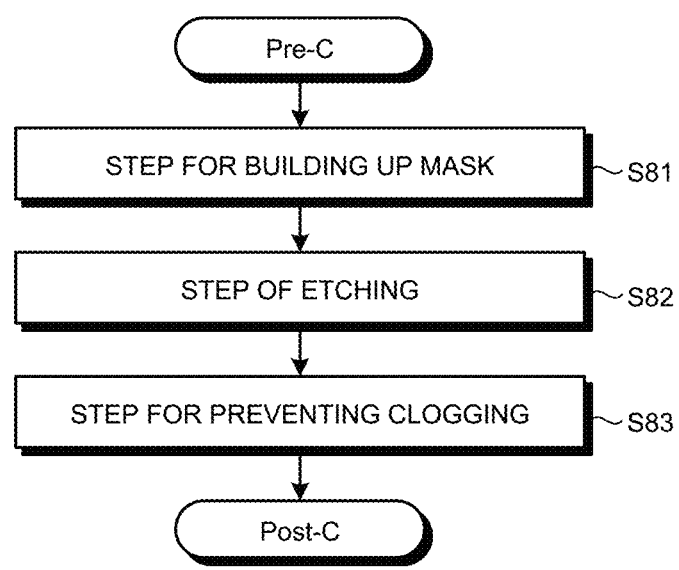
FIG. 10 is a flowchart of exemplary cycle 3 of a method for processing a substrate according to one embodiment.

FIG. 8 is a flowchart of exemplary cycle 1 of the method for processing a substrate according to one embodiment. Exemplary cycle 1 includes the step for forming a protective film (Step S61) and the step for building up a mask (Step S62). In the exemplary cycle 1, first, the protective film is formed on the side wall of the organic film 32 in the step for forming a protective film. Thereafter, the height of the hard mask (the silicon-containing film 33) reduced by sputtering in the step for forming a protective film is recovered in the step for building up a mask. In FIGS. 8 to 10, "Pre-C" indicates a previous cycle, and "Post-C" indicates a subsequent cycle.

FIG. 9 is a flowchart showing exemplary cycle 2 of the method for processing a substrate according to one embodiment. Exemplary cycle 2 includes the step of etching (Step S71) and the step for preventing clogging (Step S72). In the exemplary cycle 2, first, the organic film 32 is patterned by etching the organic film 32. Thereafter, the products deposited on the side wall of the opening or the side wall of the upper portion of the pattern in the etching step are removed in the step for preventing clogging.

FIG. 10 is a flowchart showing exemplary cycle 3 of the method for processing a substrate according to one embodiment. Exemplary cycle 3 includes the step for building up a mask (Step S81), the step of etching (Step S82), and the step for preventing clogging (Step S83). In the exemplary cycle 3, first, the reduced height of the hard mask (the silicon-containing film 33) is recovered. Thereafter, the pattern of the organic film 32 is etched in a depth direction. Then, the product deposited on the side wall of the opening or the side wall of the upper portion of the pattern in the step of etching is removed.

The shape of the pattern can be controlled by combining the exemplary cycles 1 to 3 according to the depth of the pattern of the organic film 32. For example, the exemplary cycle 1 may be performed before etching (where the organic film 32 has not been etched). Then, the protective film may be formed by sputtering the silicon-containing film 33 while etching the organic film 32, thus preventing the bowing of the organic film 32. Furthermore, the step for building up a mask can supplant the top portion of the silicon-containing film 33 that has disappeared by sputtering. Subsequently, the exemplary cycle 2 may be performed after the organic film 32 is etched, for example, when the etched depth reaches a region where bowing is likely to occur. The region where the bowing is likely to occur, e.g., a region right below the silicon-containing film 33 is covered by the protective film 40. Thus, the organic film 32 can be etched without causing a bowing. Furthermore, the products generated from the etching and deposited on the side wall of the opening and the side wall of the upper portion of the pattern can be removed in the step for preventing clogging. Since the etching of the organic film 32 also removes the hard mask, the exemplary cycle 3 may be performed. In the exemplary cycle 3, the etching can be performed after the hard mask is built up. In addition, the clogging of the opening at the top of the pattern can be prevented.

In this way, the cycles each including some of the step for forming a protective film, the step of etching, the step for building up a mask, and the step for preventing clogging can be combined according to the state of the pattern, e.g., the depth of the pattern, formed on the structure S. Therefore, the shape of the pattern can be controlled.

Figure 11:
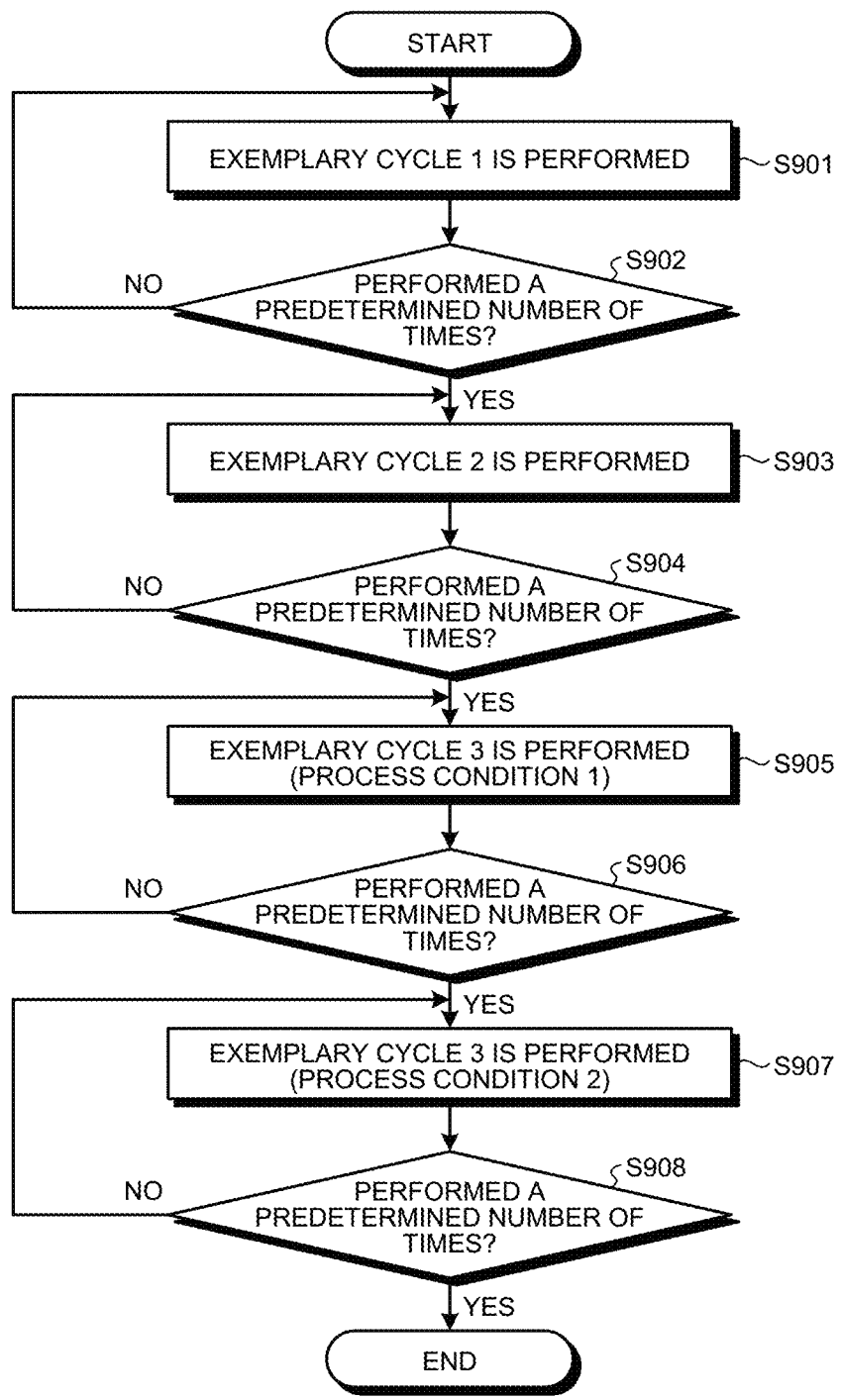
FIG. 11 is a flowchart of a combination of exemplary cycles of a method for processing a substrate according to one embodiment.

FIG. 11 is a flowchart of an exemplary combination of cycles of the method for processing a substrate according to one embodiment. In the example shown in FIG. 11, firstly the exemplary cycle 1 is performed a predetermined number of times, for example, five times; then the exemplary cycle 2 is performed a predetermined number of times, for example, three times; and the exemplary cycle 3 is performed a predetermined number of times, for example, four times. The process condition of the exemplary cycle 3 is changed during the process. For example, the exemplary cycle 3 may be performed three times, and the process condition may be changed, and again the exemplary cycle 3 may be performed once based on the changed process condition.

First, the exemplary cycle 1 is performed (Step S901). Then, it is determined whether the exemplary cycle 1 is performed a predetermined number of times (Step S902). When it is determined that the exemplary cycle 1 is not performed a predetermined number of times (Step S902, No), the process returns to Step S901, and the exemplary cycle 1 is repeated. On the other hand, when it is determined that the exemplary cycle 1 is performed a predetermined number of times (Step S902, Yes), the process proceeds to Step S903, and the exemplary cycle 2 is performed. Then, it is determined whether the exemplary cycle 2 is performed a predetermined number of times (Step S904). When it is determined that the exemplary cycle 2 is not performed a predetermined number of times (Step S904, No), the process returns to Step S903, and the exemplary cycle 2 is repeated. On the other hand, when it is determined that the exemplary cycle 2 is performed a predetermined number of times (Step S904, Yes), the process proceeds to Step S905, and the exemplary cycle 3 is performed. Here, the exemplary cycle 3 at Step S905 is performed under a process condition 1. For example, under the process condition 1, the processing time of the step for building up a mask may be set to 10 seconds. Subsequently, it is determined whether the exemplary cycle 3 based on the process condition 1 is performed a predetermined number of times (Step S906). When it is determined that the exemplary cycle 3 is not performed a predetermined number of times (Step S906, No), the process returns to Step S905, and the exemplary cycle 3 is repeated. On the other hand, when it is determined that the exemplary cycle 3 is performed a predetermined number of times (Step S906, Yes), the process proceeds to Step S907, and the exemplary cycle 3 is performed. The exemplary cycle 3 at Step S907 is performed under a process condition 2. For example, under the process condition 2, the processing time of the step for building up a mask is set to 20 seconds. Then, it is determined whether the exemplary cycle 3 under the process condition 2 is performed a predetermined number of times (Step S908). When it is determined that the exemplary cycle 3 is not performed a predetermined number of times (Step S908, No), the process returns to Step S907, and the exemplary cycle 3 is repeated. On the other hand, when it is determined that the exemplary cycle 3 is performed a predetermined number of times (Step S908, Yes), the process ends.

In this way, in the method for processing a substrate according to the embodiment, the steps to be performed and the processing conditions are changed according to the processing state of the pattern formed on the structure S, for example, how much the etching has been done. Further, the process according to the embodiment is simple because it consists of repeatedly performed cycles, each of which is a combination of steps.

Result of Experimentation

Figure 12:
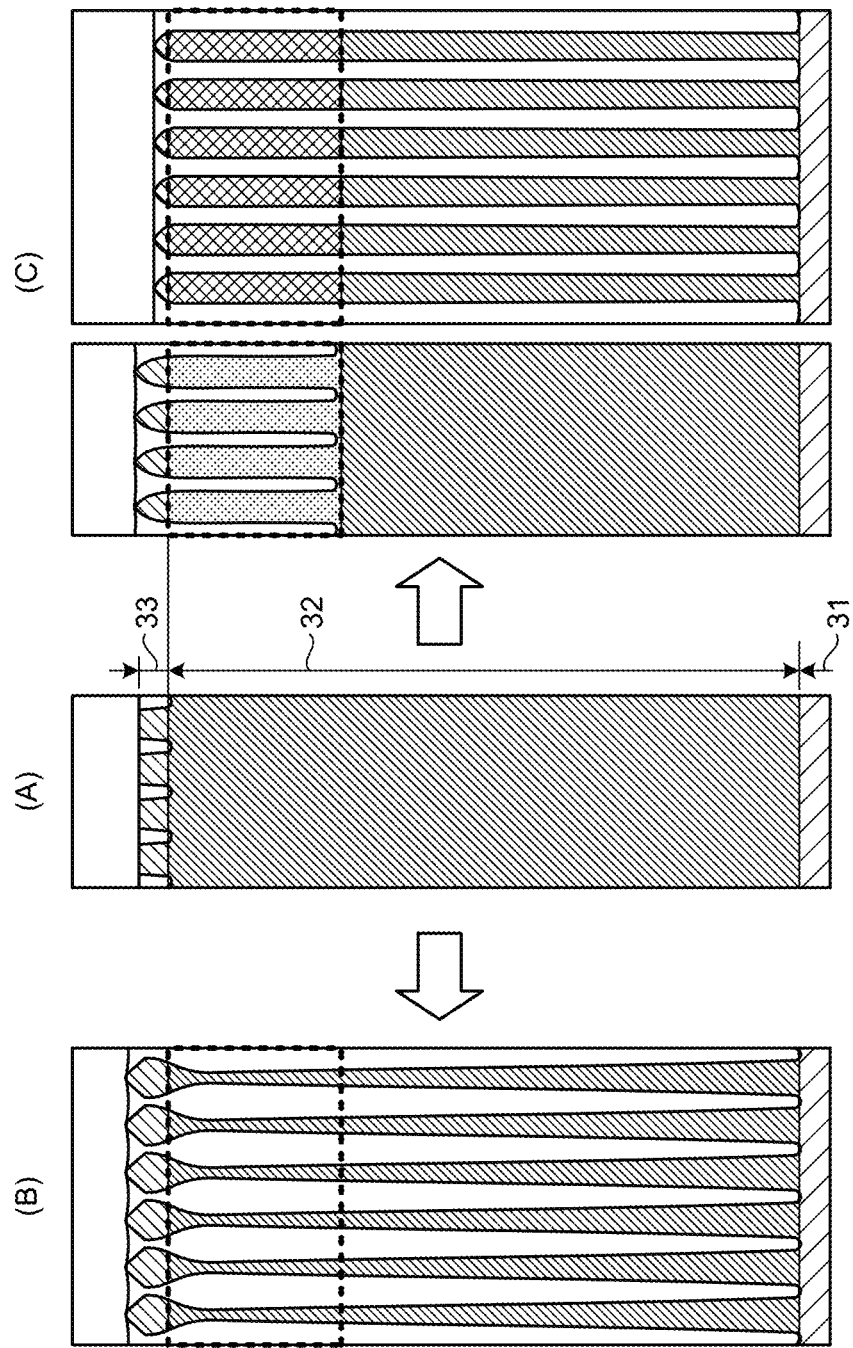
FIG. 12 is a diagram for explaining effects obtained by the method for processing a substrate according to one embodiment.

FIG. 12 is a view for explaining effects obtained by the method for processing a substrate according to one embodiment. In FIG. 12, (A) shows a state where the silicon-containing film 33, formed on the organic film 32, is patterned (the depicted shape corresponds to that shown in FIG. 2). In (A), the vertical dimensions of each of the insulating film 31, the organic film 32, and the silicon-containing film 33 are each indicated by a single-sided or double-sided arrow. Further, (B) shows a state (comparative example) of the structure of (A) after the step of etching is performed without the formation of the protective film (40 in FIG. 3). Further, (C) shows a state (example) of the structure of (A) after the organic film is patterned by the method for processing a substrate according to the embodiment.

The structures were formed to have the insulating film 31 (film to be etched), the organic film 32 (mask) formed on the insulating film 31, and the silicon-containing film 33 (hard mask) formed on the organic film 32. Thereafter, as shown in (A) of FIG. 12, an opening was formed in the silicon-containing film 33. In (A), the organic film 32 was slightly removed due to the influence of the etching.

First, in the comparative example (B), a mixed gas of $O_2$ gas and COS gas was supplied into the chamber at a flow rate of 250/50, and the organic film 32 was etched through the silicon-containing film 33 as a hard mask. The pressure of the chamber was set to 20 mTorr, and the voltages of the upper electrode and the lower electrode were set to 1400 W and 500 W, respectively. Further, the frequencies of the upper electrode and the lower electrode were set to 27 MHz and 13 MHz, respectively. Further, the temperatures (T/W/B) of the top, the side wall and the bottom of the chamber were set to 120° C., 100° C., and 10° C., respectively. Further, the length of the step of etching was set to 300 seconds and the step was performed once.

In the example (C), the exemplary cycles 1 to 3 were performed with the combinations shown in FIG. 11. The order is as follows. First, the exemplary cycle 1 was performed five times, the exemplary cycle 2 was performed three times, and then the exemplary cycle 3 was performed four times. In the first three of the exemplary cycles 3, the step for preventing clogging was performed 10 seconds. In the last of the exemplary cycles 3, the step for building up a mask was performed for 20 seconds.

The processing conditions of each of the step for forming a protective film, the step of etching, the step of building up a mask, and the step for preventing clogging are as follows.
Step for Forming a Protective Film:
  Chamber pressure: 20 mTorr
  Voltage of upper electrode and lower electrode:
0 W+900 W
  Flow rate of $H_2$ gas: 250 sccm
  Chamber temperature: T/W/B=120° C./100° C./10° C.
  Processing time: 120 seconds
Step of Etching:
  Chamber pressure: 20 mTorr
  Flow rate of processing gas: $O_2/CO_2$=250 sccm/50 sccm
  Chamber temperature: T/W/B=120° C./100° C./10° C.
  Processing time: 100 seconds
Step for Building Up a Mask:
  Chamber pressure: 20 mTorr
  Voltage of upper electrode and lower electrode:
800 W+0 W
  Flow rate of processing gas: $Ar/O_2/SiCl_4$=500 sccm/100 sccm/20 sccm
  Chamber temperature: T/W/B=120° C./100° C./10° C.

Step for Preventing clogging:
  Chamber pressure: 30 mTorr
  Voltage of upper electrode and lower electrode: 300 W+140 W
  Flow rate of processing gas: CHF3/CF4/N2=300 sccm/100 sccm/150 sccm
  Chamber temperature: T/W/B=120° C./100° C./10° C.
  Processing time: 30 seconds A structure shown in (B) of FIG. 12 was obtained by the processing of the comparative example. As can be seen from (B) of FIG. 12, in the comparative example, bowing has occurred in the upper portion of the organic film 32 (a portion indicated by a dotted rectangle). Thus, the pattern formed in the organic film 32 is generally tapered from the top to the bottom, and the dimension of the opening is slightly narrowed at the bottom of the pattern (about 78 nm). The vertical dimension of the pattern is about 2500 nm.

In contrast, in the example ((C) of FIG. 12), first, the protective film 40 was formed by the exemplary cycle 1, and the pattern shown on the left side of (C) was formed in the upper portion of the organic film 32 (see the figure on the left side of (C) of FIG. 12). After the aspect ratio reached approximately 5, the exemplary cycles 2 and 3 were performed to complete the pattern of the organic film 32 (see the figure on the right side of (C) of FIG. 12).

As can be seen from (C) of FIG. 12, in the example, bowing hardly occurs in the upper portion of the organic film 32. Therefore, the spread in the lateral direction is significantly reduced as compared with the comparative example (a portion indicated by a dotted rectangle). Specifically, the lateral dimension of the bowing, which was about 170 nm in the comparative example, was improved to about 105 nm in the example. Further, the taper from the top to the bottom of the pattern formed on the organic film 32 is generally reduced, and the dimension of the opening at the bottom of the pattern is improved as compared with the comparative example (about 87 nm).

In the step for forming a protective film in the above embodiment, hydrogen (H2) gas was used as the processing gas. However, the processing gas other than hydrogen gas can be used as the processing gas in the step for forming a protective film, as long as the rate of formation of the protective film is higher than the rate of bowing formation during the etching.

Region where a Protective Film is to be Formed

Figure 13:
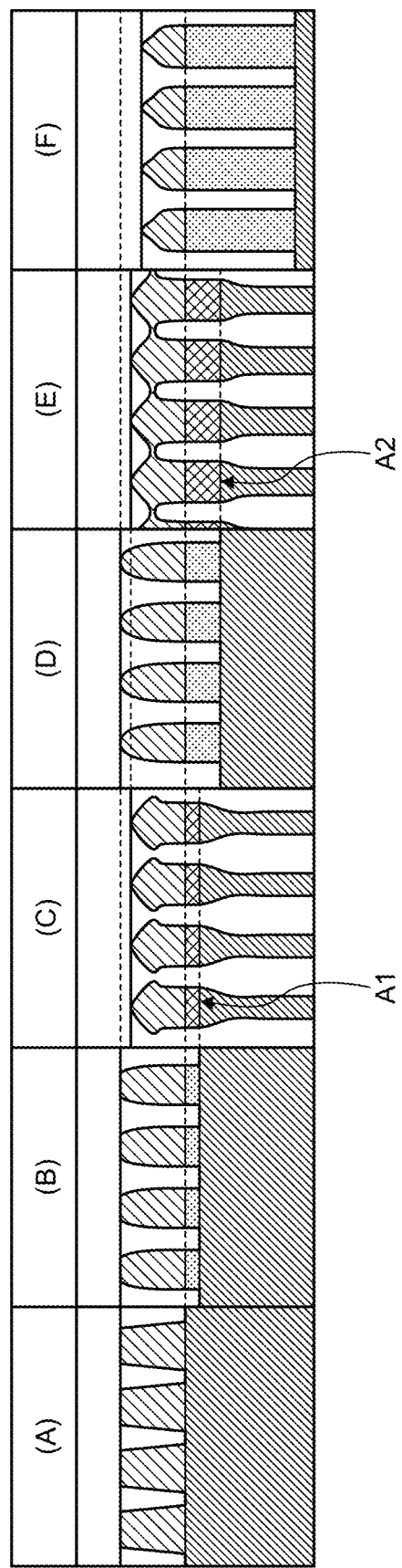
FIG. 13 shows exemplary structures for explaining conditions for determining whether or not to perform a process step in a method for processing a substrate according to one embodiment.

The inventors also studied conditions used for determining whether or not to perform the step for forming a protective film. FIG. 13 is a view for explaining conditions used when determining whether or not to perform the step for forming a protective film in the method for processing a substrate according to one embodiment. By referring to FIG. 13, the condition B used for determining whether or not to perform the step for forming a protective film will be described.

Six patterns (A) to (F) shown in FIG. 13 respectively show examples of the following states.

(A) State 1: immediately after a pattern is formed on the silicon-containing film 33 of the structure S
(B) State 2: after the step for forming a protective film is performed for 30 seconds on the pattern of State 1
(C) State 3: after the step of etching is performed for 300 seconds on the pattern of State 2
(D) State 4: after the step for forming a protective film is performed for 120 seconds on the pattern of State 1
(E) State 5: after the step of etching is performed for 300 seconds on the pattern of State 4
(F) State 6: after the step for forming a protective film is performed for 600 seconds on the pattern of State 1

In the example of FIG. 13, the processing conditions of the step for forming a protective film and the step of etching are as follows.

Step for Forming a Protective Film:
  Chamber pressure: 20 mTorr
  Voltage of upper electrode and lower electrode: 0 W+900 W
  Flow rate of processing gas: H2=250
  Chamber temperature: T/W/B=120° C./100° C./10° C.

Step of Etching:
  Chamber pressure: 20 mTorr
  Voltage of upper electrode and lower electrode: 1400 W+500 W
  Flow rate of processing gas: O2/CO2=250 sccm/50 sccm
  Chamber temperature: T/W/B=120° C./100° C./10° C.

In State 1 shown in (A) of FIG. 13, an opening tapered from the top to the bottom is formed in the silicon-containing film 33 of the structure S. Thickness of the silicon-containing film 33 shown in the example of FIG. 13 is about 215 nm. When the step for forming a protective film is performed on the structure S under the above processing conditions for 30 seconds, as shown in (B), the organic film 32 is etched, and the protective film 40 is formed on the side wall of the opening formed by the etching.

When the step of etching is performed on the structure S in State 2 for 300 seconds, bowing that expands laterally occurs in the opening in the organic film 32 from immediately below the organic film 32, and a portion of the organic film 32 is removed to form the shape shown in (C). In State 3, the opening formed in the organic film 32 has no bowing at the position where the protective film 40 is formed (the position indicated by A1 in FIG. 13). Bowing occurs from immediately below the protective film 40.

When the processing time of the step for forming a protective film is extended from 30 seconds to 120 seconds, the depth of the opening formed on the organic film 32 increases, and accordingly, the region where the protective film 40 is formed extends in the depth direction ((D) of FIG. 13). In State 4 shown in (D), the protective film 40 is formed to a depth of about 130 nm from the top of the organic film 32 (see a portion indicated by A2 in FIG. 13). When the etching step is performed on the structure S in State 4 under the above processing conditions for 300 seconds, as shown in (E), the position where bowing occurs moves lower than that of the example of (C), and the amount of bowing decreases. Thus, it can be seen that the position and amount of bowing can be controlled by forming the protective film 40. However, in the example of (E), as a result of the step of etching, the silicon-containing film 33 serving as a mask is removed, and the opening is clogged by deposits on the top.

Further, as shown in (F), when the step for forming a protective film is performed on the structure S in State 1 under the above processing conditions for 600 seconds, the protective film 40 formed on the organic film 32 reaches a depth of about 380 nm in the opening. As the processing time of the step for forming a protective film becomes longer, the amount of the silicon-containing film 33 that is removed (etched) also increases. In the example shown in (F), a portion of the mask of the silicon-containing film 33 is removed in a thickness direction, and the mask is distorted in shape and has a rough surface.

Thus, when the aspect ratio of the pattern formed in the organic film 32 is higher, the problems such as the loss of the mask and the clogging of the opening in the silicon-containing film 33 occur when the step for forming a protective film and the step of etching are simply repeated. On the other hand, as a result of the above experiments, the present inventors have found that bowing can be effectively reduced by forming the protective film on the upper portion of the opening when the pattern formed in the organic film 32 has a diameter of about 100 nm and a depth of about 2000 to 3000 nm. For example, for an opening with a diameter of 100 nm, bowing was significantly reduced by forming the protective film 40 on a region of about 500 nm from the top. Further, bowing was significantly reduced by forming the protective film 40 on a region having an aspect ratio of about 6.7. From these, the inventors concluded that the shape of the pattern could be improved by forming the protective film 40 on a region having an aspect ratio of about 5 to 7.

Exemplary Apparatus for Processing a Substrate

Figure 14:
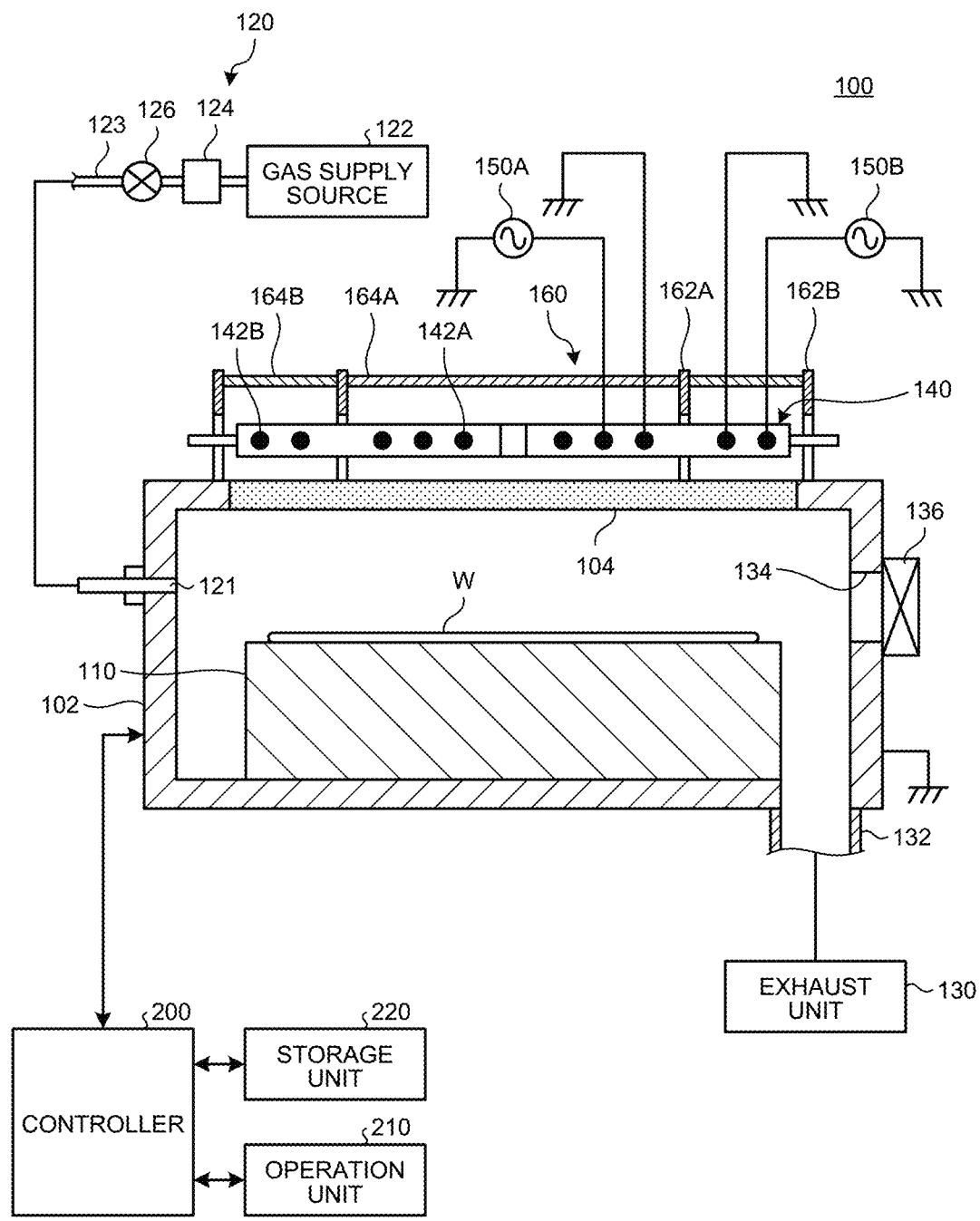
FIG. 14 illustrates an exemplary configuration of an apparatus for processing a substrate according to one embodiment.

FIG. 14 is a sectional view of a schematic configuration of a substrate processing apparatus 100 according to one embodiment. The substrate processing apparatus 100 includes a processing chamber (chamber) 102 formed of a metal (e.g., aluminum) in a tubular shape (e.g., cylindrical shape).

A substrate support 110 for placing substrate is provided on the bottom of the processing chamber 102. The substrate support 110 has a substantially columnar shape (e.g., cylindrical shape) made of aluminum or other metal. The substrate support 110 may have various functions as required, such as an electrostatic chuck, and a temperature control mechanism such as a heater and a coolant channel. In an etching apparatus, a bias radio-frequency power for drawing ions into the substrate W is supplied to the substrate support 110.

A plate-like dielectric 104 made of, for example, quartz glass, ceramic, or other material is provided on the ceiling of the processing chamber 102 to face the substrate support 110. Specifically, the plate-like dielectric 104 is formed, for example, in a disc shape, and is hermetically attached to close an opening formed in the ceiling of the processing chamber 102.

The processing chamber 102 is provided with a gas supply unit 120 that supplies a processing gas, or other gases. A gas inlet 121 is formed in a side wall of the processing chamber 102. A gas supply source 122 is connected to the gas inlet 121 via a gas supply line 123. A flow controller for controlling the flow rate of the processing gas, for example, a mass flow controller (MFC) 124 and an opening and closing valve 126 are arranged in the gas supply line 123. According to this gas supply unit 120, the processing gas from the gas supply source 122 is controlled to a predetermined flow rate by the mass flow controller 124 and is supplied from the gas inlet 121 into the processing chamber 102.

For simplicity of explanation, in FIG. 14, the gas supply unit 120 is represented as a single line system. However, the gas supply unit 120 is not limited to one supplying the processing gas of one type. The gas supply unit 120 may supply more than one type of the processing gas. In this case, a plurality of gas supply sources may be provided and configured with a plurality of gas supply lines, and each gas supply line may be provided with a mass flow controller. FIG. 14 shows an example where the gas supply unit 120 is configured to supply gas from the side wall of the processing chamber 102, but the disclosure is not necessarily limited to this. For example, gas may be supplied from the ceiling of the processing chamber 102. In this case, for example, a gas inlet may be formed at, for example, the center of the plate-like dielectric 104, and gas may be supplied from the gas inlet.

As the processing gas supplied into the processing chamber 102 by the gas supply unit 120, a halogen-based gas containing Cl, F or the like is used for etching an oxide film, for example. Specifically, when etching a silicon oxide film such as $SiO_2$ film, a fluorocarbon gas such as $C_xF_y$, $CHF_3$ gas is used as the processing gas.

An exhaust unit 130 for exhausting the atmosphere in the processing chamber 102 is connected to the bottom of the processing chamber 102 via an exhaust line 132. The exhaust unit 130 is configured by, for example, a vacuum pump, and can reduce the pressure in the processing chamber 102 to a predetermined pressure. A substrate loading/unloading port 134 is provided in the side wall of the processing chamber 102. The substrate loading/unloading port 134 is provided with a gate valve 136. For example, when loading the substrate W, the gate valve 136 is opened, and the substrate W is placed on the substrate support 110 in the processing chamber 102 by a transfer mechanism such as a transfer arm (not shown). Then, the gate valve 136 is closed, and the substrate W is processed.

On the ceiling of the processing chamber 102, a planar radio-frequency antenna 140 and a shield member 160 for covering the antenna 140 are arranged on an upper surface (outer surface) of the plate-like dielectric 104. The radio-frequency antenna 140 in the present embodiment is roughly configured by an inner antenna element 142A arranged at the center of the plate-like dielectric 104 and an outer antenna element 142B arranged to surround the outer periphery of the inner antenna element 142A. Each of the antenna elements 142A, 142B is formed in a spiral coil shape made of, for example, a conductor such as copper, aluminum, and stainless steel.

The shield member 160 in the present embodiment includes a tubular inner shield wall 162A provided between the antenna elements 142A, 142B so as to surround the inner antenna element 142A, and a tubular outer shield wall 162B provided so as to surround the outer antenna element 142B. The upper surface of the plate-like dielectric 104 is divided into a central portion (central zone) inside the inner shield wall 162A and a peripheral portion (peripheral zone) between the shield walls 162A, 162B.

A disc-shaped inner shield plate 164A for closing an opening of the inner shield wall 162A is provided over the inner antenna element 142A. A donut-shaped outer shield plate 164B for closing an opening between the shield walls 162A, 162B is provided over the outer antenna element 142B.

The shape of the shield member 160 is not limited to a cylindrical shape. Although the shield member 160 may have other shapes such as a rectangular tube shape, it is desirable to match it with the shape of the processing chamber 102. Here, for example, the processing chamber 102 is formed in a substantially cylindrical shape, and accordingly, the shield member 160 is also formed in a substantially cylindrical shape.

Radio-frequency power supplies 150A, 150B are separately coupled to the antenna elements 142A, 142B, respectively. Thereby, a radio-frequency with the same frequency or different frequencies may be supplied to each of the antenna elements 142A, 142B. For example, when a radio-frequency with a predetermined frequency (e.g., 40 MHz) is supplied at a predetermined power from the radio-frequency power supply 150A to the inner antenna element 142A, an induction magnetic field is formed in the processing chamber 102. The processing gas introduced into the processing chamber 102 is excited by the induction magnetic field, and donut-shaped plasma is generated at the center above the substrate W.

When a radio-frequency with a predetermined frequency (e.g., 60 MHz) is supplied at a predetermined power from the radio-frequency power supply 150B to the outer antenna element 142B, an induction magnetic field is formed in the processing chamber 102. The processing gas introduced into the processing chamber 102 is excited by the formed induction magnetic field, and another donut-shaped plasma is generated at the periphery on the substrate W.

A predetermined plasma process on the substrate, such as asking, etching, and deposition is performed by the above plasma. The radio-frequency output from each of the radio-frequency power supplies 150A, 150B is not limited to the above-described frequency. For example, a radio-frequency with various frequencies such as 13.56 MHz, 27 MHz, 40 MHz, and 60 MHz can be supplied. However, it is necessary to adjust the electrical length of each of the antenna elements 142A, 142B according to the radio-frequency output from the radio-frequency power supplies 150A, 150B.

A controller (overall control device) 200 is connected to the substrate processing apparatus 100. Each unit of the substrate processing apparatus 100 is controlled by the controller 200. Further, the controller 200 is connected with an operation unit 210 that includes a keyboard for allowing an operator to input commands so as to manage the substrate processing apparatus 100, and a display for visualizing and displaying the operation status of the substrate processing apparatus 100, and the like.

Furthermore, the controller 200 is connected with a storage unit 220 that stores a program for realizing various processes performed by the substrate processing apparatus 100 under the control of the controller 200, and recipe data necessary for performing the program, and the like.

For example, the storage unit 220 stores a recipe or the like for performing a process such as cleaning in the processing chamber 102, in addition to a plurality of process recipes for performing the processing on the substrate W. These recipes are obtained by collecting a plurality of parameter values such as control parameters for controlling each unit of the substrate processing apparatus 100 and setting parameters. For example, the process recipe has parameter values such as a flow ratio of the processing gas, a pressure in the processing chamber 102, and a frequency and power of a radio-frequency applied to each of the antenna elements 142A, 142B.

These recipes may be stored in a hard disk or a semiconductor memory. Alternatively the recipes may be stored in a portable computer-readable storage medium such as a CD-ROM or a DVD. These medium may be set in a predetermined position of the storage unit 220.

The controller 200 realizes a desired process in the substrate processing apparatus 100 by reading a desired process recipe from the storage unit 220 based on instructions or the like from the operation unit 210 and controlling each unit of the substrate processing apparatus 100. The recipe can be edited via the operation unit 210.

Meanwhile, although, in this embodiment, an Inductively Coupled Plasma (ICP) apparatus is illustrated as an example, the substrate processing apparatus 100 may be a Capacitively Coupled Plasma (CCP) apparatus. Further, in addition to the radio-frequency antenna 140 provided on the ceiling of the processing chamber 102, a radio-frequency power may be supplied to a lower electrode included in the substrate support 110 to generate plasma.

Advantageous Effect

The substrate processing method according to the above embodiment includes providing a substrate having a first film and a second film on the first film and having an opening formed in the second film and turning a first processing gas into plasma to etch the first film and to form a protective film on a sidewall of the first film by sputtering of the second film. In the substrate processing method according to the embodiment, the formation of the protective film by the sputtering of the second film and the etching of the first film can be performed in parallel. Therefore, according to the embodiment, the first film can be etched while reducing the bowing of the first film (organic film). Further, according to the substrate processing method of the embodiment, the protective film can be formed at a position where bowing is likely to occur, so that bowing can be effectively suppressed. The first step may be performed, for example, until an aspect ratio of a pattern formed on the first film becomes at least 5.

Further, the substrate processing method according to the embodiment may further include a second step of turning a second processing gas into plasma and etching the first film through the second film.

Further, the substrate processing method according to the embodiment may further include a third step of turning a third processing gas into plasma and forming a silicon-containing film at the top of the second film. Therefore, according to the embodiment, the etching can be continued by increasing a film on the second film by the third step when the amount of the second film functioning as a mask is reduced. Therefore, according to the embodiment, a pattern having a high aspect ratio can be formed on the first film.

Further, the substrate processing method according to the embodiment may further include a fourth step of turning a fourth processing gas into plasma and removing what clogs an upper portion of a pattern and/or an opening generated in any one of the first step, the second step and the third step. Therefore, according to the embodiment, the etching can be performed while reducing the clogging of the opening by appropriately preforming the fourth step when there is a possibility that the opening or the upper portion of the pattern is clogged by a deposition.

Further, in the substrate processing method according to the embodiment, a plurality of cycles in which one or more steps including at least one of the second step, the third step or the fourth step are combined may be performed in a predetermined order and a predetermined number of times. Therefore, according to the embodiment, the shape formed by etching can be controlled by performing a process suitable for the degree of progress of the etching.

Further, in the substrate processing method according to the embodiment, a pattern having an aspect ratio of 20 or more may be formed on the first film.

Further, in the substrate processing method according to the embodiment, the first processing gas that is a hydrogen-containing gas may be turned into plasma, and the second film that is an anti-reflection film may be sputtered.

Further, the substrate processing method according to the embodiment may further include a step of etching an alternately stacked portion of a silicon oxide film and a silicon oxynitride film via the first film.

Further, the substrate processing apparatus according to the embodiment includes a storage unit configured to store a program for performing the substrate processing method, and a controller for controlling the program to be performed.

Therefore, according to the embodiment, the shape of the pattern formed on the substrate by etching can be controlled.

The embodiments described in this disclosure are examples in all respects, and should be considered not to be restrictive. The embodiments may be omitted, replaced or changed in various forms without departing from the scope of the appended claims and the spirit thereof.

What is claimed is:

1. A method of processing a substrate, comprising:
   (a) providing the substrate having a first film and a second film on the first film, and having an opening formed in the second film;
   (b) etching the first film with a plasma generated from a first processing gas, the etching including forming a protective film on a sidewall of the first film by sputtering of the second film; and
   (c) removing an excessive deposition that clogs an upper portion of a pattern formed in the first film and/or the opening with a plasma generated from a second processing gas.

2. The method according to claim 1,
   wherein the etching includes continuing the etching until an aspect ratio of a pattern formed in the first film is at least 5.

3. The method according to claim 1, further comprising:
   (d) etching the first film through the opening in the second film with a plasma generated from a third processing gas.

4. The method according to claim 1, further comprising:
   (d) forming a silicon-containing film at a top of the second film with a plasma generated from a third processing gas.

5. The method according to claim 1,
   wherein the first processing gas includes a hydrogen-containing gas, and the second film being an anti-reflection film.

6. The method according to claim 1, further comprising:
   etching, after (b),
      a portion below the first film where a silicon oxide layer and a silicon nitride layer are alternately arranged, or
      a portion where a silicon oxide layer and a polycrystalline silicon layer are alternately arranged, or
      a portion where a silicon oxide layer and a silicon oxynitride layer are alternately arranged.

7. The method according to claim 1, further comprising:
   (c) etching the first film through the opening in the second film with a plasma generated from a second processing gas; and
   (d) forming a silicon-containing film at a top of the second film with a plasma generated from a third processing gas.

8. A method of processing a substrate, comprising:
   (a) providing the substrate having a first film and a second film on the first film, and having an opening formed in the second film;
   (b) etching the first film with a plasma generated from a first processing gas, the etching including forming a protective film on a sidewall of the first film by sputtering of the second film;
   (c) etching the first film through the opening in the second film with a plasma generated from a second processing gas;
   (d) forming a silicon-containing film at a top of the second film with a plasma generated from a third processing gas; and
   (e) removing an excessive deposition that clogs an upper portion of a pattern formed on the first film and/or the opening with a plasma generated from a fourth processing gas,
   wherein one or more cycles each including at least one step selected from the group consisting of (c), (d), and (e) are performed in order and for a predetermined number of times.

9. The method according to claim 8,
   wherein the one or more cycles provides the first film with a pattern having an aspect ratio of 20 or more.

* * * * *